United States Patent [19]
Ochi et al.

[11] 4,004,245
[45] Jan. 18, 1977

[54] WIDE COMMON MODE RANGE DIFFERENTIAL AMPLIFIER

[75] Inventors: Sam S. Ochi, San Jose; Ronald W. Russell, Sunnyvale, both of Calif.

[73] Assignee: National Semiconductor Corporation, Santa Clara, Calif.

[22] Filed: May 3, 1976

[21] Appl. No.: 682,287

[52] U.S. Cl. .............................. 330/30 D; 330/22; 330/35

[51] Int. Cl.² .......................................... H03F 3/45

[58] Field of Search ............. 330/22, 30 D, 35, 69, 330/146

[56] References Cited
UNITED STATES PATENTS 3,854,101  12/1974  Murumatsu .................... 330/35 X
3,970,950  7/1976  Freeman, Jr. et al. .......... 330/35 X

*Primary Examiner*—Rudolph V. Rolinec
*Assistant Examiner*—Lawrence J. Dahl
*Attorney, Agent, or Firm*—Gail W. Woodward

[57] ABSTRACT

A differential input is applied to four bridge-connected field effect transistors. The bridge drives a differential common base transistor stage. The output can be either differential or single ended as desired taken from the transistor collectors. The circuit provides good common mode rejection and good differential response to signals over a common mode range that exceeds the voltage of the power supply.

8 Claims, 2 Drawing Figures

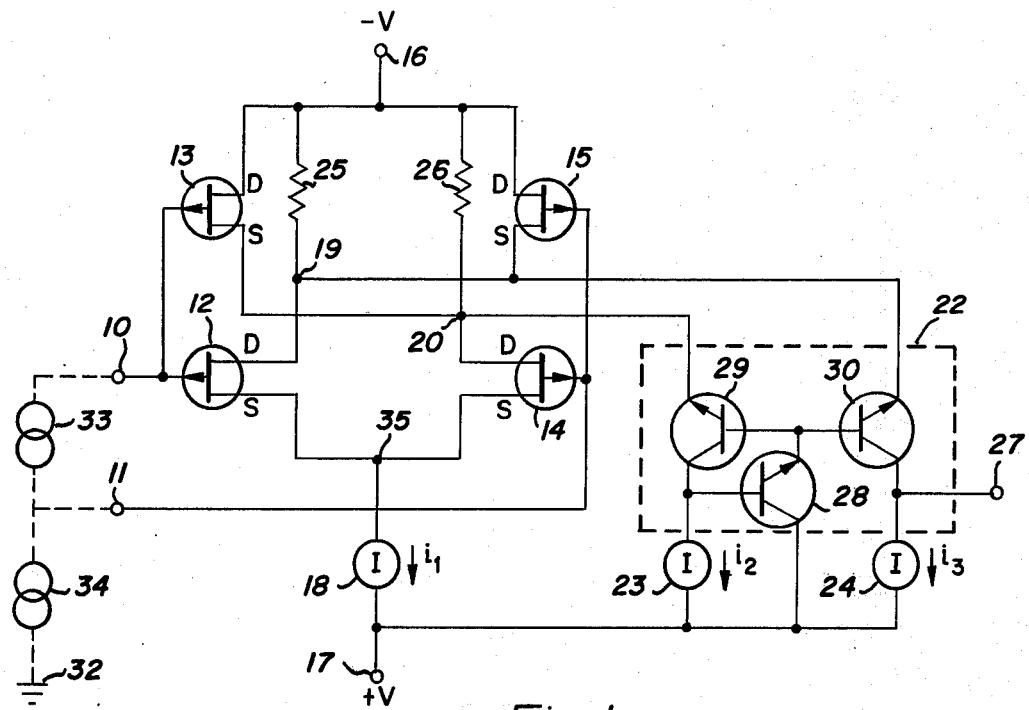
Fig_1
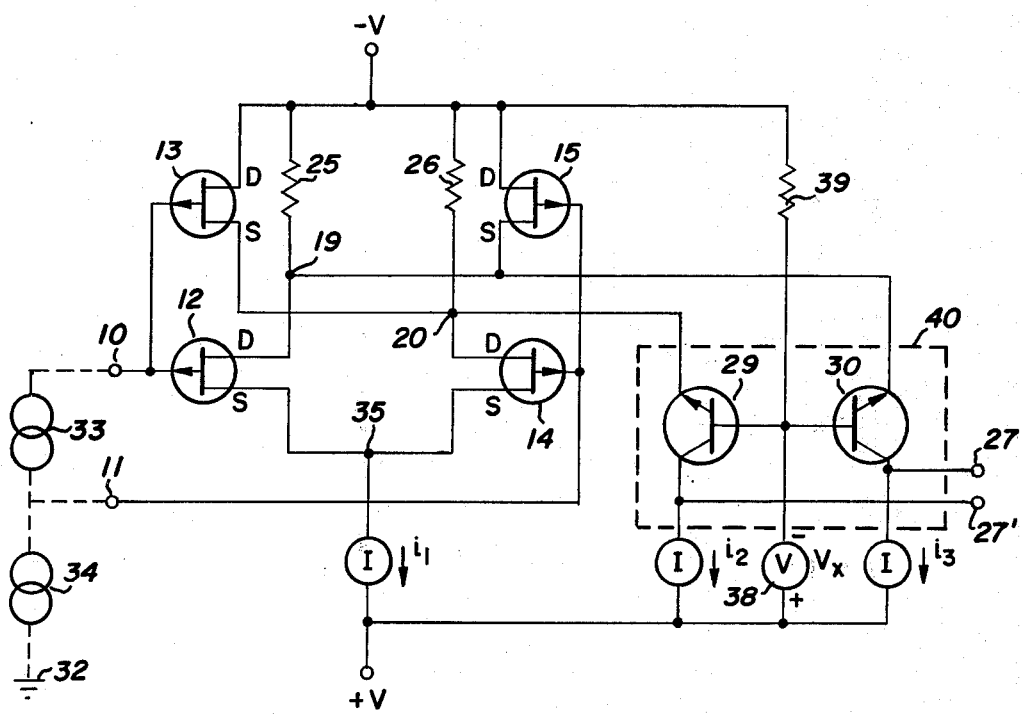
Fig_2

WIDE COMMON MODE RANGE DIFFERENTIAL AMPLIFIER

BACKGROUND OF THE INVENTION

Differential amplifiers having a large common mode voltage range have been known and circuits are known wherein one power supply terminal voltage is embraced in the common mode range. For example in many applications one power supply terminal constitutes system ground. In this case it is often desirable to operate a differential amplifier input circuit at ground so that the input operates about the potential of the grounded power supply terminal. The prior art circuits adapted for such operation work well with the input at ground but will not function when the input is operated at a level near to the potential at the other power supply terminal.

SUMMARY OF THE INVENTION

It is an object of the invention to provide a differential amplifier circuit that has a common mode range that exceeds both power supply terminal voltages.

It is a feature of the invention that the circuit permits differential amplifier operation with the input operating at a d-c level near either the positive or negative power supply terminal.

These and other objects are achieved in a circuit using FETs and bipolar transistors in combination. A bridge connected FET input stage drives the emitters of a common base transistor differential amplifier stage. The FET bridge is operated from a constant current source and the common base transistors are operated from equal-value constant-current collector sources. In a typical example using a particular power supply one common mode limit will be about a FET pinch off over the positive supply terminal and within a gate to source junction potential below the negative power supply terminal. Thus the common mode voltage range can be several volts in excess of the total supply voltage.

BRIEF DESCRIPTION OF THE DRAWING

FIG. 1 is a schematic diagram of the circuit of the invention with a single ended output; and FIG. 2 is a schematic diagram of the circuit of the invention with a differential output.

DESCRIPTION OF THE INVENTION

FIG. 1 shows an embodiment of the invention. Terminals 10 and 11 comprise the differential signal input. Terminal 10 is directly connected to the gates of FETs 12 and 13. Terminal 11 is directly connected to the gates of FETs 14 and 15. The source-drain circuits of the four FETs 12–15 are connected into a bridge configuration. The bridge is energized from power supply terminals 16 and 17 by way of constant current device 18. The bridge output at nodes 19 and 20 connect directly to a common base differential amplifier 22. Differential amplifier 22 has two transistors 29 and 30 along with equal value constant current devices 23 and 24 in the collectors and matched resistors 25 and 26 in the emitters. A single ended output 27 is taken from amplifier 22 in which transistor 28 acts to convert the differential signal to a single ended signal. Transistors 29 and 30 which make up the gain portion of amplifier 22 can be separate transistors or they can be a composite dual emitter-dual collector device.

Constant current devices 18, 23, and 24 may be conventional two-terminal devices, for example self biased FETs operated in saturation. Alternatively all three can be combined into a unitary structure as for example a multiple collector transistor (in the schematic shown a PNP device) with constant voltage emitter-base bias. Each source would represent a separate collector with size being ratioed with respect to the others for the desired current values, $i_1$, $i_2$, and $i_3$.

For the following description a 20-volt potential is applied between terminals 16 and 17, although other values can be used. An arbitrary ground reference 32 is established at mid potential so that terminal 16 is at −10 volts and terminal 17 is at +10 volts. If desired the circuit parameters can be set so that with no input, terminal 27 will be at zero volts, or ground potential.

Generator 33 constitutes a representative differential input to the amplifier at terminals 10 and 11. Generator 34 constitutes a representative common mode input referenced to ground 32. It can be seen that the common mode signal acts on the bridge connected FETs 12–15 so that nodes 19 and 20 will have no differential potential. Also since the impedance into amplifier 22 is very low and the impedance of source 18 very high, the common mode signal due to input 34 as it appears at nodes 19 and 20 will be greatly attenuated. Thus the voltage at node 35 will track the common mode input. However the differential input due to generator 33 will unbalance the bridge and a potential difference will appear between nodes 19 and 20 thus driving the differential amplifier 22 in push-pull fashion. Since the FET circuit is self tracking, the FET gates will be reverse biased and the circuit input will be of extremely high impedance.

Assuming zero common mode potential means that node 35 is somewhat more negative and nodes 19 and 20 still more negative. For this set of conditions FETs 13 and 15 will be pinched off while FETs 12 and 14 operate conventionally as drain followers. Resistors 25 and 26 are necessary to complete the drain circuit to −V terminal 16. If a common mode signal drives terminals 10 and 11 more positive (toward the potential of terminal 17), terminal 35 will track until its potential is so close to the potential at terminal 17, that current source 18 becomes inactive. To do this will require that terminals 10 and 11 be driven more positive than terminal 17 by an amount approaching the FET $V_p$ which can be typically about 5 volts. Thus a positive common mode input excursion of about 14 volts can be tolerated.

If the input terminals 10 and 11 are driven negative, toward the potential of terminal 16, node 35 will follow but as node 35 approaches the potential of nodes 19 and 20, FETs 12 and 14 go from a saturated to a resistive region of operation. If operation is extended too far into this region a large signal phase shift may be encountered. However as this condition is approached FETs 13 and 15 become active to provide source-follower action between terminals 10 and 11 and nodes 20 and 19 respectively. Differential signal phase information is preserved by virtue of the cross-connected sources of FETs 13 and 15. FETs 13 and 15 will remain active until the common mode signal drives their gates into forward biased conduction. This occurs at a potential slightly negative with respect to the potential at terminal 16. From the above it can be seen that the total common mode range actually exceeds the 20 volt supply potential.

FIG. 2 shows an alternative embodiment of the invention wherein a differential output is available on terminals 27 and 27'. The circuit is similar to that of FIG. 1 and carries the same reference numerals where appropriate. Transistor 28 has been omitted and the common base connection of transistors 29 and 30 returned to a constant voltage Vx as set by device 38 in conjunction with resistor 39. In practice Vx is made about 0.6 volt more positive than the potential desired at nodes 19 and 20. Thus amplifier stage 40 acts to provide a differential output in response to a differential input between terminals 10 and 11. Otherwise the circuit operates as does that of FIG. 1.

The circuits shown provide highly desirable characteristics and are well suited for integration into monolithic structures as is well known in the art. While NPN transistors and P-channel FETs are shown, PNP transistors in combination with N-channel FETs could be used provided that the +V and −V are interchanged. Clearly still other equivalents and modifications will occur to a person skilled in the art. Therefore it is intended that our invention be limited only by the claims that follow.

We claim:

1. A differential amplifier having a pair of signal input terminals, at least one output terminal, and a pair of supply terminals for connecting said amplifier to the positive and negative terminals of a source of power, said amplifier comprising:

first, second, third, and fourth FETs, each having a source, a drain, and a gate electrode;

means coupling the sources of said first and second FETs together and to a source of constant current referenced to one of said supply terminals:

means coupling the drain terminals of said third and fourth FETs together and to the other of said supply terminals, means coupling the drain of said first FET and the source of said third FET together and to a first low impedance load element, means coupling the drain of said second FET and the source of said fourth FET together and to a second low impedance load element, means coupling the gates of said first and said fourth FETs together and to one of said input terminals, and means coupling the gates of said second and said third FETs together and to the other of said input terminals, whereby differential signals between said input terminals produce differential signals in said first and said second low impedance load elements and common mode signals applied to said input terminals result in virtually no load element signal response over a range that exceeds the voltage levels of both supply terminals.

2. The amplifier of claim 1 wherein said low impedance load elements comprise the emitters of a pair of transistors, said transistors being connected as common base amplifiers having collectors coupled by way of constant current elements to one of said supply terminals and emitters coupled by way of impedance means to the other of said supply terminals.

3. The amplifier of claim 2 wherein said output terminal is coupled to the collector of one of said transistors to provide a single ended output and the collector of the other of said transistors is coupled to a transistor emitter follower that drives the bases of said common base amplifiers.

4. The amplifier of claim 2 wherein said output is in differential form taken from the collectors of said common base amplifiers and the bases of said common base amplifiers are coupled to a source of constant voltage.

5. The circuit of claim 2 wherein said transistors are of the NPN variety and said FETs are P-channel devices.

6. The circuit of claim 5 wherein said FETs and transistors are fabricated on a common substrate in integrated circuit form.

7. The circuit of claim 2 wherein said transistors are of the PNP variety and said FETs are N-channel devices.

8. The circuit of claim 7 wherein said FETs and transistors are fabricated on a common substrate in integrated circuit form.

* * * * *